US006903982B2

(12) United States Patent
Ma et al.

(10) Patent No.: US 6,903,982 B2
(45) Date of Patent: Jun. 7, 2005

(54) BIT LINE SEGMENTING IN RANDOM ACCESS MEMORIES

(75) Inventors: David SuitWai Ma, Cary, NC (US); Aiqin Chen, Cary, NC (US)

(73) Assignee: Infineon Technologies AG, Munich (DE)

( * ) Notice: Subject to any disclaimer, the term of this patent is extended or adjusted under 35 U.S.C. 154(b) by 273 days.

(21) Appl. No.: 10/269,005

(22) Filed: Oct. 10, 2002

(65) Prior Publication Data

US 2004/0073745 A1 Apr. 15, 2004

(51) Int. Cl.[7] .................................................. G11C 7/00
(52) U.S. Cl. .......................... 365/189.01; 365/189.03; 365/203; 365/230.03
(58) Field of Search ....................... 365/189.01, 189.03, 365/203, 230.03, 185.21, 204, 230.06, 185.23, 185.25, 185.26; 711/105

(56) References Cited

U.S. PATENT DOCUMENTS

| | | | | |
|---|---|---|---|---|
| 4,800,525 A | * | 1/1989 | Shah et al. ................... 365/72 |
| 4,868,823 A | * | 9/1989 | White et al. ................ 714/720 |
| 5,796,671 A | * | 8/1998 | Wahlstrom ............. 365/230.03 |
| 5,859,794 A | * | 1/1999 | Chan .......................... 365/149 |
| 6,052,323 A | * | 4/2000 | Kawamura .................. 365/205 |
| 6,058,065 A | * | 5/2000 | Lattimore et al. ...... 365/230.03 |
| 6,333,866 B1 | * | 12/2001 | Ogata ........................... 365/63 |
| 6,335,890 B1 | * | 1/2002 | Reohr et al. ............. 365/225.5 |
| 6,335,896 B1 | * | 1/2002 | Wahlstrom ............. 365/230.03 |
| 6,504,785 B1 | * | 1/2003 | Rao ....................... 365/230.05 |
| 6,594,191 B2 | * | 7/2003 | Lammers et al. ........ 365/225.5 |
| 2004/0057279 A1 | * | 3/2004 | Clark et al. ................. 365/164 |

OTHER PUBLICATIONS

IBM Technical Disclosure Bulletin, Dec. 1988, "Fully–Divided Bit Line for Dynamic Random–Access Memory Sensing Circuitry", vol. No.: 31, Issue No.: 7, p. No.: 266–272.*

* cited by examiner

Primary Examiner—Hong Kim
(74) Attorney, Agent, or Firm—Moser, Patterson & Sheridan, L.L.P.

(57) ABSTRACT

An integrated memory circuit and corresponding method for segmenting bit lines are provided, where the integrated memory circuit includes a sense amplifier, a layered bit line in signal communication with the sense amplifier, several segment pass transistors in signal communication with the layered bit line, several segmented bit lines, each in signal communication with a corresponding one of the several segment pass transistors, respectively, several memory cell pass transistors in signal communication with one of the several segmented bit lines, and a plurality of memory cell capacitors, each in signal communication with a corresponding one of the plurality of memory cell transistors, respectively; and where the corresponding method for segmenting bit lines includes receiving a memory cell address, activating a memory cell pass transistor with a wordline corresponding to the memory cell address, receiving a signal indicative of the memory cell charge level on a segmented bit line through the memory cell transistor, activating a segment pass transistor corresponding to the memory cell address, receiving a signal indicative of the memory cell charge level on a layered bit line through the segment pass transistor, and receiving a signal indicative of the memory cell charge level at the sense amplifier through the layered bit line.

20 Claims, 4 Drawing Sheets

BIT LINE SEGMENTING IN RANDOM ACCESS MEMORIES

BACKGROUND OF THE INVENTION

The present disclosure relates to random access memories ("RAMs"), and more particularly, to an apparatus and method for segmenting bit lines in RAMs.

In a typical computing system, a memory hierarchy supports a central processing unit ("CPU") with data storage capabilities. Generally, the type of memory device used as the primary random access memory ("RAM") in a computing system is dynamic random access memory ("DRAM"). DRAM is comparatively low in cost and high in density, facilitating the storage of large quantities of data within a small volume of the computing system. Unlike static random access memory ("SRAM"), which generally has a lower density than DRAM, data stored in DRAM must be refreshed periodically to prevent the data from being lost due to charge leakage from the DRAM memory cells.

Since data stored in DRAMs discharges after remaining idle for a period of time, DRAMs require refresh cycles to maintain their data. Memory cells in DRAMs must be periodically refreshed within a certain period of time. Each DRAM memory is typically organized into memory banks, with each memory bank having a corresponding sense amplifier ("SA"). Data refresh is typically accomplished by accessing each row in each memory bank, one row at a time. When the memory banks are accessed to be refreshed, data stored in the memory cells of the banks are read to sense amplifiers, and immediately written back to the memory cells. A capacitor corresponding to each memory cell is thus recharged to its initial value.

Bit lines interconnect the sense amplifiers with the memory cells. Unfortunately, only a limited number of cells can be attached to each bit line ("BL"). Otherwise, the total load on each BL becomes too great, and the sense amplifiers are no longer able to sense a dumping of a logic "1" or a logic "0" charge from each memory cell.

SUMMARY OF THE INVENTION

These and other drawbacks and disadvantages of the prior art are addressed by an apparatus and method for segmenting bit lines in integrated memory circuits.

The apparatus is an integrated memory circuit including a sense amplifier, a layered bit line in signal communication with the sense amplifier, several segment pass transistors in signal communication with the layered bit line, several segmented bit lines, each in signal communication with a corresponding one of the several segment pass transistors, respectively, several memory cell pass or "mbit" transistors in signal communication with one of the several segmented bit lines, and a plurality of memory cell capacitors, each in signal communication with a corresponding one of the plurality of memory cell transistors, respectively.

The corresponding method for segmenting bit lines includes receiving a memory cell address, activating a memory cell pass transistor with a wordline corresponding to the memory cell address, receiving a signal indicative of the memory cell charge level on a segmented bit line through the memory cell transistor, activating a segment pass transistor corresponding to the memory cell address, receiving a signal indicative of the memory cell charge level on a layered bit line through the segment pass transistor, and receiving a signal indicative of the memory cell charge level at the sense amplifier through the layered bit line.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches an apparatus and method for segmenting bit lines in DRAMs, in accordance with the following exemplary figures, in which.

DETAILED DESCRIPTION OF PREFERRED EMBODIMENTS

An apparatus and method are provided for segmenting bit lines in dynamic random access memories ("DRAMs").

As the array sizes of current dynamic random access memory ("DRAM") integrated circuits continue to be increased, the maximum allowable load on each bit line has become a limiting factor. Thus, to further increase memory array density, an apparatus and method for bit line segmenting in DRAMs is presented in this disclosure.

In typical DRAMs, only a limited number of memory cells can be attached to each bit line ("BL"), such as, for example, five hundred and twelve memory cells per BL. If this number is exceeded, the total load on the BL will become too great, and the sense amplifier ("SA") will no longer be able to sense a dumping of logic "1" or logic "0" charge from a single memory cell. Thus, embodiments of the present disclosure operate to reduce the loads on the BLs, allowing more memory cells to be connected to each BL and/or enabling faster read and write operations due to the consequential reduction in delay times.

Although exemplary embodiments are described in the present disclosure, specific structural and functional details disclosed herein are merely exemplary for purposes of describing preferred embodiments of the present invention. Thus, it shall be understood that the same bit line segmenting concept can be applied to any DRAM, including those used for cache level memories.

Figure 1:
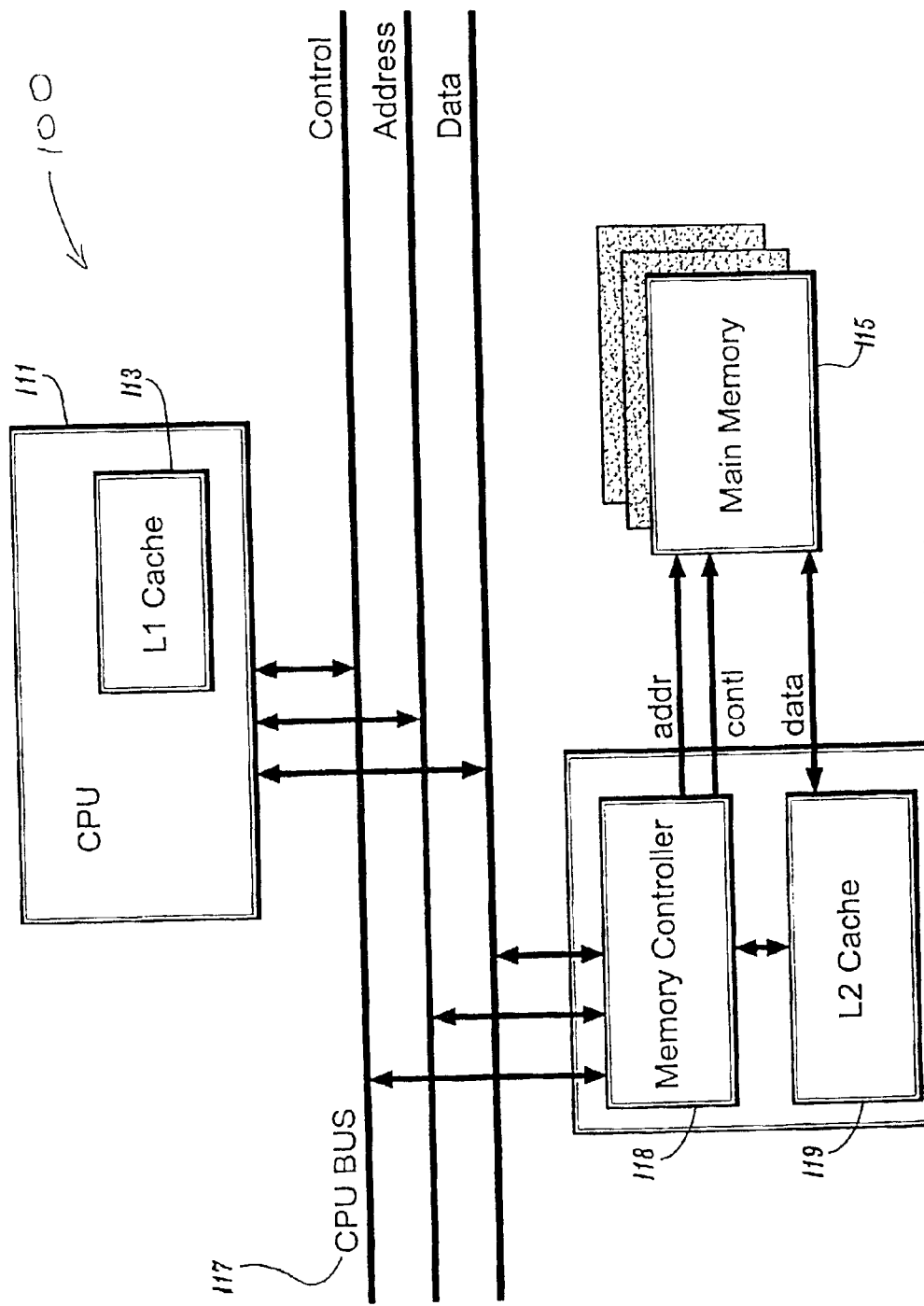
FIG. 1 shows a block diagram of a computing system with DRAM memory where exemplary embodiments of the present disclosure are applied.

As shown in FIG. 1, a memory organization for a computing system is generally indicated by the reference numeral 100. The computing system 100 includes a central processing unit ("CPU") 111 with an on-chip cache memory ("L1 cache") 113, a main memory 115, a CPU bus 117, a memory controller 118 for controlling data traffic on the CPU bus 117, and a second level cache memory ("L2 cache") 119.

The first level cache memory 113 is integrated on the same chip with the CPU 111. The first level cache memory 113 is typically faster because it is integrated with the CPU 111 with a higher bandwidth and shorter wire length and therefore avoids any delay associated with transmitting and/or receiving signals to and/or from an external chip. The second level cache memory 119 is located on a different chip than the CPU, and typically has a larger capacity than the first level cache memory 113 but smaller than a main memory 115.

The cache memories 113 and 119 serve as buffers between the CPU 111 and the main memory 115. The computing system preferably employs DRAM for at least the main memory 115, which therefore requires a data refresh process. Thus, a method of accessing and/or refreshing data according to the present invention is described with respect to the main memory 115. However, it shall be understood that the present invention is equally applicable to any DRAM memory, such as, for example, any DRAM memory used anywhere in a hierarchical memory system, including, for example, cache memories.

Figure 2:
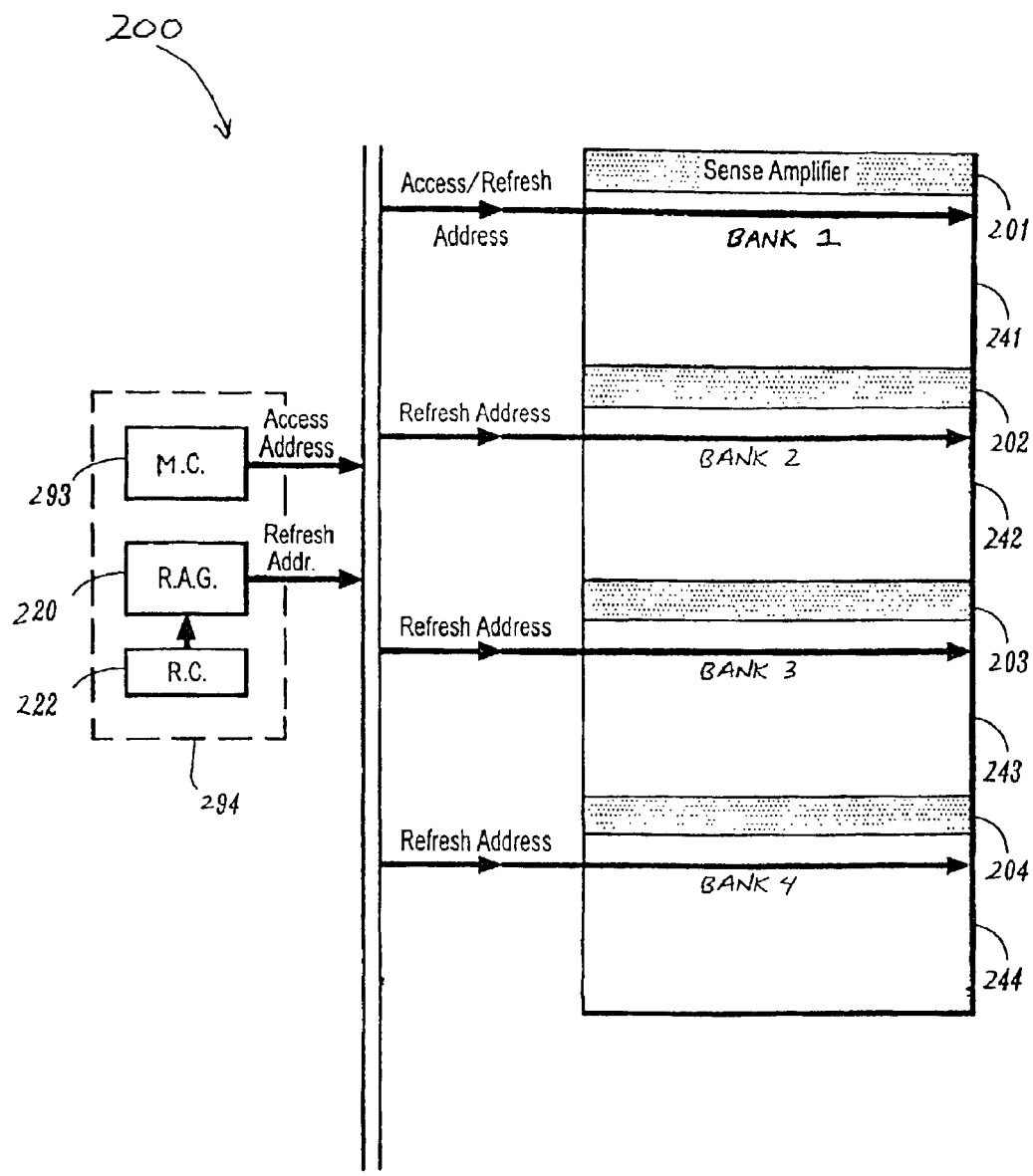
FIG. 2 shows a block diagram illustrating several memory banks of the DRAM memory of FIG. 1.

Referring to FIG. 2, the reference numeral 200 generally indicates a DRAM data memory with wordline addresses applied to the memory contents. The DRAM data memory 200 has multiple banks, 241, 242, 243 and 244, respectively, each bank having a corresponding sense amplifier, 201, 202, 203 and 204, respectively. Data stored in each of the banks may be accessed by a corresponding wordline address. Assuming that a wordline on which a read/write operation requested by the CPU 111 of FIG. 1 is to be performed is located in a first bank 241, the access address corresponding to the wordline is provided to the first bank 241. In a refresh mode of operation, the refresh address generator 220 generates refresh addresses to the banks 241–244, respectively. In the case of four banks 241–244, each bank is identified, for example, by two digits of a bank address to access any wordline in the bank. For example, the two digits of a bank address may be '00', '01', '10', or '11', which designate the first 241, second 242, third 243 or fourth bank 244, respectively.

Figure 3:
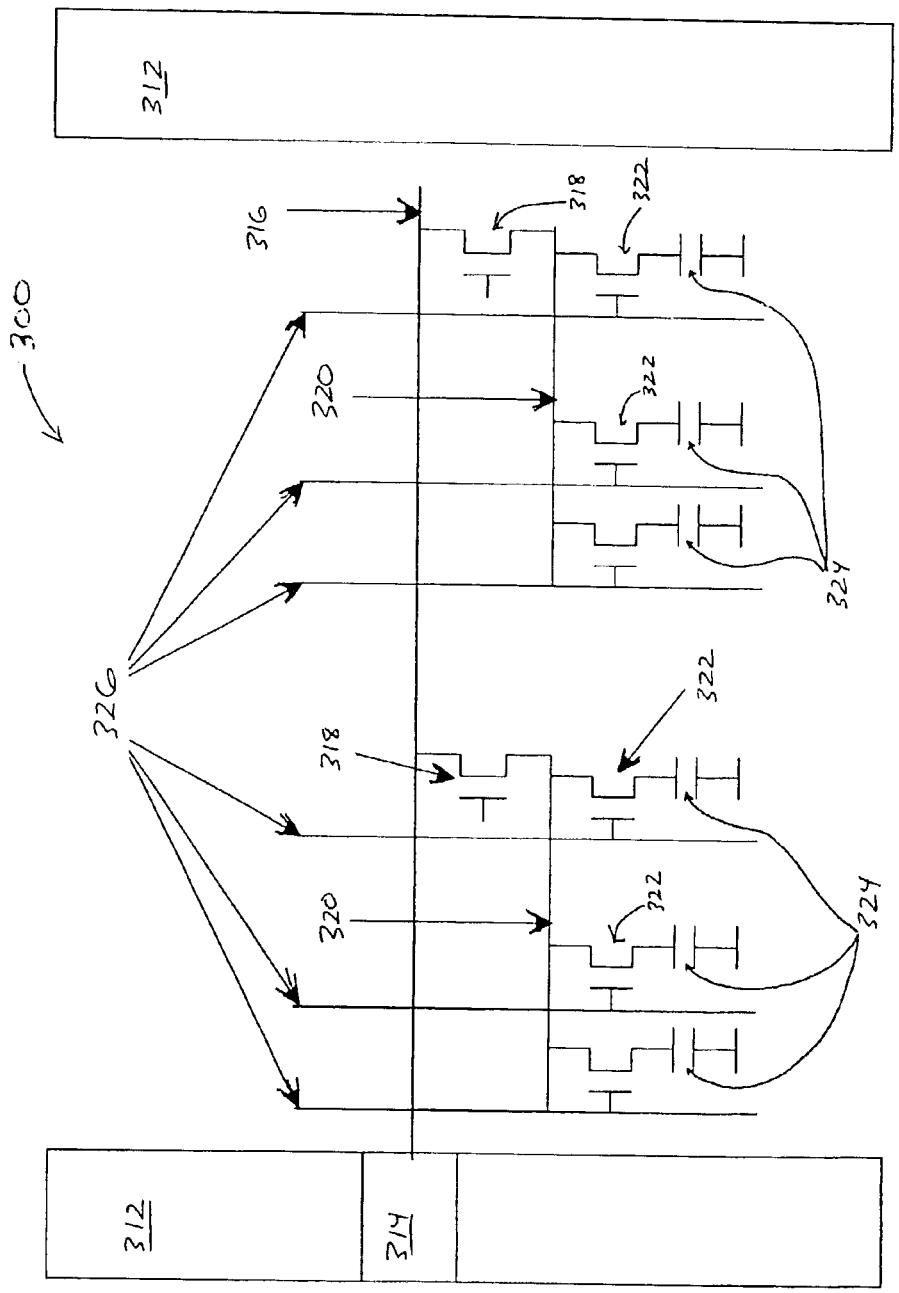
FIG. 3 shows a schematic diagram illustrating several memory cells of a DRAM memory bank of FIG. 2.

A refresh address generator 220 preferably includes a refresh counter 222, which provides refresh timing and addresses of wordlines for all banks in which a refresh operation is to be performed. The refresh counter 222 is, for example, tracking the wordline addresses for each bank to be refreshed. When one wordline data address is refreshed, the refresh counter 222 generates the next address of the banks for refresh. When all the wordlines in the activated bank are refreshed, the refresh counter 222 is reset to zero and starts to refresh the first wordline again in the next refresh cycle. Turning to FIG. 3, a bank of DRAM is indicated generally by the reference numeral 300. The bank 300 includes a sense amplifier row 312 having a number of single sense amplifiers 314. A single sense amplifier 314 is in signal communication with a layered bit line 316 ("BL1"). The layered bit line 316, in turn, is in signal communication with at least two segment pass transistors or switches 318. Each segment pass transistor 318 is in signal communication with a segmented bit line portion 320 ("BL0"). Each segmented bit line portion 320 is in signal communication with a number of pass transistors or switches 322. Each pass transistor 322, in turn, is in signal communication with a corresponding memory cell capacitor 324. A word line 326 is in signal communication with each pass transistor 322. In this exemplary embodiment, there are sixty-four memory cells 324 and sixty-four corresponding pass transistors 322 coupled in signal communication with each segmented bit line portion 320, and there are eight segmented bit line portions 320 and segment pass transistors 318 coupled in signal communication with the bit line 316. Although only the BL signal line is shown, the structure for the complimentary BL-BAR signal line is the same. For example, the memory cells 324 are shown only for the BL signal line, corresponding to even numbered wordlines, while the memory cells for the BL-BAR signal line, which is not shown, correspond to the odd numbered wordlines. Thus, the single sense amplifier 314 of this exemplary embodiment supports (64*8*2)=1024 memory cells.

BL1 may be thought of as a second BL layer, with BL0 corresponding to an original BL layer for comparison purposes. Thus, assuming that there are 1024 memory cells, and that BL0 is segmented into eight sections as described; each section has one hundred and twenty-eight pass transistors and one hundred and twenty-eight memory cell capacitors, sixty-four on the BL signal line and sixty-four on the BL-BAR signal line.

To quantify the reduction in bit line load for this exemplary embodiment, the engineering calculations for BL capacitance on a typical prior art array, using conservation of charge, are as follows, where "VBLH" is the bit line high voltage, "VBLEQ" is the bit line equalized voltage, "Vbump" is the most that a cell can affect or bump the bit line voltage, "Ccell" is the capacitance of a single memory cell, "Qc" is the charge on a cell, "Qbl" is the charge on a bit line, "Qtotal" is the charge on a bit line after a wordline acitvates a cell, and "Cbl" is the bit line capacitance or load:

$$VBLH=1.6V \; VBLEQ=0.8V \; Vbump=0.1V \; Ccell=32 \; fF$$

$$Qc=VBLH*Ccell \; Qbl=VBLEQ*Cbl$$

$$Qtotal=(VBLEQ+Vbump)*(Ccell+Cbl)=Qc+Qbl$$

$$VBLEQ+Vbump=(VBLH*Ccell+VBLEQ*Cbl)/(Ccell+Cbl)$$

$$VBLEQ+Vbump=VBLH*Ccell/(Ccell+Cbl)+VBLEQ*Cbl/(Ccell+Cbl)$$

Since Cbl>>Ccell, Cbl/(Ccell+Cbl) approaches unity and:

$$VBLEQ+Vbump=VBLH*Ccell/(Ccell+Cbl)+VBLEQ*1$$

$$Vbump=VBLH*Ccell/(Ccell+Cbl)$$

Solving for Cbl:

$$Cbl=Ccell*(VBLH/Vbump)-Ccell$$

$$Cbl=32 \; fF*(1.6 \; V/0.1 \; V)-32 \; fF=480 \; fF$$

For comparison with the exemplary embodiment of the present disclosure, where BL0 is segmented into eight segments, each with sixty-four cells on each BL0 segment, then each segment of the exemplary embodiment will be only 60 fF. Note that eight is an arbitrarily selected even number, and that other segmenting dividers of between about two and about five hundred and twelve are presently contemplated.

For the calculation of the BL1 capacitance, which is directly on top of the segmented BL0 in this exemplary embodiment, but may be under the segmented BL0 in alternate embodiments, the BL1 line capacitance will be 0.355 fF/um if it is assumed to be a metal layer ("M1") with the following physical characteristics, where "M0" is the lowest metal layer and may be tungsten in alternate embodiments, "M2" is an upper metal layer, and "GC" is a gate layer:

Width=0.15 um Spacing=0.13 um

M0 overlap=100% GC overlap=75% M2 overlap 75%

Thus, the BL1 capacitance is 0.355 fF/um*296 um=99.16 fF

Using this method, a memory cell on the first of the eight BL0 segments, for example, will only see a total BL capacitance of about 160 fF, instead of the original 480 fF. This means, for example, that BL length can be increased by a factor of 3 for a BL capacitance of 360 fF, or by a factor of 4 for a BL capacitance of 460 fF. This reduction in BL capacitance can result in a smaller array from the savings on sense amplifier size, and more importantly a reduction in the number of rows of sense amplifiers needed. Alternatively or in conjunction therewith, the reduced capacitance can be used to decrease the access time.

Figure 4:
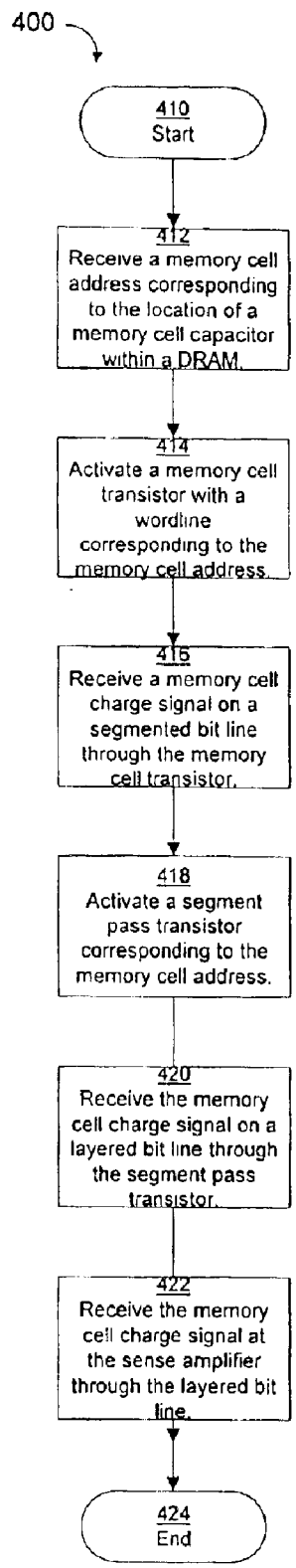
FIG. 4 shows a flow diagram for segmenting bit lines in DRAMs according to an exemplary embodiment of the present disclosure.

Referring now to FIG. 4, the reference numeral 400 generally indicates a flowchart for using an integrated memory circuit having segmented bit lines. A start block 410 passes control to a function block 412, which receives a memory cell address corresponding to the location of a memory cell capacitor within a DRAM. The function block 412, in turn, passes control to a function block 414, which activates a memory cell transistor with a wordline corresponding to the memory cell address. The function block 414, in turn, passes control to a function block 416, which receives a memory cell charge signal on a segmented bit line through the memory cell transistor. The function block 416, in turn, passes control to a function block 418, which activates a segment pass transistor corresponding to the memory cell address. The function block 418, in turn, passes control to a function block 420, which receives the memory cell charge signal on a layered bit line through the segment pass transistor. The function block 420 passes control to a function block 422, which receives the memory cell charge signal at the sense amplifier through the layered bit line, and passes control to an end block 424.

In operation, exemplary embodiments of the present disclosure use BL segmenting to reduce the BL load and/or increase the number of cells supported by each BL. The original BL ("BL0") is segmented and a second BL layer ("BL1") is added. Pass transistors are used to connect each BL0 segment to the new BL1 layer. Segment pass transistors turn on only when the segment each controls has cells activated. Otherwise, a given segment pass transistor is off and all BL1 sees is the load from the contact and source of the corresponding segment pass transistor. During precharge, all segment pass transistors are turned on.

Thus, embodiments of the present disclosure increase array efficiency by reducing the number of rows of sense amplifiers. In addition, the die size may be reduced and/or a greater number of memory cells may be added to DRAMs embodying the presently disclosed teachings.

In alternate embodiments of the present disclosure, bit line segmenting is used to reduce the load on each sense amplifier without deleting any sense amplifiers. In such embodiments implemented without reducing the number of sense amplifier rows, a reduction in bit line load and correspondingly improved signal and sensing are attained. In addition, smaller sensing amplifiers may be used in conjunction with the segmented bit lines.

Having described an apparatus and method for segmenting bit lines in DRAM memories, modifications and variations may be made by those of ordinary skill in the pertinent art in light of the teachings of the present disclosure. These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

It is to be further understood that, because some of the constituent system components and methods depicted in the accompanying drawings are preferably implemented in firmware, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure. Although the illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. Such changes and modifications are included within the scope and spirit of the present disclosure as set forth in the appended claims.

What is claimed is:

1. A method for segmenting data in a memory circuit having a sense amplifier, the method comprising:

receiving a memory cell address; motivating a memory cell pass transistor with a wordline corresponding to the memory cell address;

receiving a signal indicative of the memory cell charge level on a segmented bit line through the memory cell transistor;

activating a segment pass transistor corresponding to the memory cell address; receiving a signal indicative of the memory cell charge level on a layered bit line through the segment pass transistor; and receiving a signal indicative of the memory cell charge level at the sense amplifier through the layered bit line.

2. A method as defined in claim 1, further comprising amplifying the received signal indicative of the memory cell charge level at the sense amplifier.

3. A method as defined in claim 1 wherein each layered bit line corresponds to from about two to about five hundred and twelve segmented bit lines.

4. A method as defined in claim 3 wherein each layered bit line corresponds to eight segmented bit lines.

5. A method as defined in claim 1 wherein each segmented bit line corresponds to from about two to about five hundred and twelve memory cells.

6. A method as defined in claim 5 wherein each segmented bit line corresponds to one hundred and twenty-eight memory cells.

7. A method as defined in claim 6 wherein each layered bit line corresponds to eight segmented bit lines, for a total of one thousand and twentyfour memory cells per layered bit line.

8. An integrated memory circuit, comprising:

a sense amplifier;

a layered bit line in signal communication with the sense amplifier;

a plurality of segment pass transistors in signal communication with the layered bit line;

a plurality of segmented bit lines, each in signal communication with a corresponding one of the plurality of segment pass transistors, respectively;

a plurality of memory cell pass transistors in signal communication with one of the plurality of segmented bit lines; and a plurality of memory cell capacitors, each in signal communication with a corresponding one of the plurality of memory cell transistors, respectively.

9. An integrated memory circuit as defined in claim 8 wherein the number of segment pass transistors in signal communication with the layered bit line is in the range of about two to about five hundred and twelve.

10. An integrated memory circuit as defined in claim 9 wherein the number of segment pass transistors in signal communication with the layered bit line is eight.

11. An integrated memory circuit as defined in claim 8 wherein the number of memory cell transistors in signal communication with one of the plurality of segmented bit lines is in the range of about two to about five hundred and twelve.

12. An integrated memory circuit as defined in claim 11 wherein the number of memory cell transistors in signal communication with one of the plurality of segmented bit lines is one hundred and twenty-eight.

13. An integrated memory circuit as defined in claim 12 wherein each layered bit line is in signal communication with eight segmented bit lines, for a total of one thousand and twenty-four memory cell capacitors per layered bit line.

14. An integrated memory circuit, comprising:

memory controlling means for receiving a memory cell address;

memory cell switching means for activating a wordline corresponding to the memory cell address;

segmenting means for receiving a signal indicative of the memory cell charge level through the memory cell switching means;

segment pass switching means for passing a signal indicative of the memory cell charge to the segmenting means;

layering means for receiving a signal indicative of the memory cell charge level through the segment pass switching means; and sensing means for receiving a signal indicative of the memory cell charge level through the layering means.

15. An integrated memory circuit as defined in claim 14, further comprising amplifying means for amplifying the received signal indicative of the memory cell charge level at the sensing means.

16. An integrated memory circuit as defined in claim 14 wherein each layering means corresponds to from about two to about five hundred and twelve segmenting means.

17. An integrated memory circuit as defined in claim 16 wherein each layering means corresponds to eight segmenting means.

18. An integrated memory circuit as defined in claim 14 wherein each segmenting means corresponds to from about two to about five hundred and twelve memory cell switching means.

19. An integrated memory circuit as defined in claim 18 wherein each segmenting means corresponds to one hundred and twenty-eight memory cell switching means.

20. An integrated memory circuit as defined in claim 19 wherein each layering means corresponds to eight segmenting means, for a total of one thousand and twenty-four memory cell switching means per layering means.

* * * * *

UNITED STATES PATENT AND TRADEMARK OFFICE
CERTIFICATE OF CORRECTION

PATENT NO. : 6,903,982 B2
DATED : June 7, 2005
INVENTOR(S) : David SuitWai Ma et al.

It is certified that error appears in the above-identified patent and that said Letters Patent is hereby corrected as shown below:

Column 6,
Line 18, replace "motivating" with -- activating --.

Signed and Sealed this

Fourth Day of October, 2005

JON W. DUDAS
*Director of the United States Patent and Trademark Office*